US008466650B2

(12) United States Patent
Reichart et al.

(10) Patent No.: US 8,466,650 B2
(45) Date of Patent: Jun. 18, 2013

(54) METHOD FOR POWERING A SURVEILLANCE CAMERA USING SOLAR GENERATED WIRELESS ENERGY

(75) Inventors: Christopher John Reichart, Miramar, FL (US); Gerald G. Glass, Miramar, FL (US)

(73) Assignee: Green Solar Transportation, LLC, Coral Springs, FL (US)

( * ) Notice: Subject to any disclaimer, the term of this patent is extended or adjusted under 35 U.S.C. 154(b) by 80 days.

(21) Appl. No.: 12/834,887

(22) Filed: Jul. 12, 2010

(65) Prior Publication Data
US 2010/0277116 A1    Nov. 4, 2010

Related U.S. Application Data

(63) Continuation-in-part of application No. 12/426,927, filed on Apr. 20, 2009.

(51) Int. Cl.
*H01M 10/46* (2006.01)
(52) U.S. Cl.
USPC .......................................... 320/101; 320/108
(58) Field of Classification Search
USPC .. 320/101, 107, 108, 114, 115, 150; 136/243, 136/244, 291, 293
See application file for complete search history.

(56) References Cited

U.S. PATENT DOCUMENTS

| | | | |
|---|---|---|---|
| 4,602,694 A | 7/1986 | Weldin | |
| 5,148,736 A | 9/1992 | Juang | |
| 5,680,907 A | 10/1997 | Weihe | |
| 5,725,062 A | 3/1998 | Fronek | |
| 6,380,481 B1 | 4/2002 | Muller | |
| 2003/0093805 A1* | 5/2003 | Gin | 725/105 |
| 2005/0206531 A1* | 9/2005 | Noel | 340/936 |
| 2009/0268438 A1* | 10/2009 | Huang | 362/183 |
| 2010/0207572 A1* | 8/2010 | Kirby et al. | 320/101 |

OTHER PUBLICATIONS

McCosh, Dan, Racing with the Sun, Popular Science Magazine, Nov. 1987, p. 84, vol. 231, No. 5, Times Mirror Magazines/Bonnier Corporation, New York, NY.
Tertzakian, Peter, A Thousand Barrels a Second: The Coming Oil Break Point and the Challenges Facing an Energy Dependent World, McGraw-Hill, 2006, pp. 8, 23 and 79.
Campbell, Colin John, Oil Crisis, Multi-science Publishing, 2005, p. 303.

* cited by examiner

*Primary Examiner* — Edward Tso
(74) *Attorney, Agent, or Firm* — Allen, Dyer, Doppelt, Milbrath & Gilchrist, P.A.

(57) ABSTRACT

A method for generating electricity from solar power to a surveillance camera, relying on a photovoltaic panels (1) circuit interruption device (3,9); charge controller (4); batteries (5); surveillance camera (7); electrical wires, and fuses. The photovoltaic panel(s) will generate electrical power that will provide sufficient power to run the surveillance camera.

4 Claims, 3 Drawing Sheets

METHOD FOR POWERING A SURVEILLANCE CAMERA USING SOLAR GENERATED WIRELESS ENERGY

CROSS-REFERENCE TO RELATED APPLICATIONS

Ser. No. 12/426,927

SEQUENCE LISTING OR PROGRAM

Not Applicable

BACKGROUND

1. Field

This application relates to solar electricity generated by photovoltaic panels and the application to run a surveillance camera, using a wireless energy field.

This application claims benefit of No. 12/426,927 filed Apr. 20, 2009.

2. Prior Art

This method relates to the solar power used to charge batteries specifically designed and dedicated to the operation of a surveillance camera using wireless electricity as a method of energy delivery.

SUMMARY

Examples of solar-power generators for vehicles are described in the following documents:

U.S. Pat. No. 5,725,062, which was issued to Froneck on Mar. 10, 1998 described a vehicle top solar power generator, where the solar panel is mounted on the top of the vehicle.

U.S. Pat. No. 4,602,694, which was issued to Weldin on Jul. 29, 1986, was limited to a detailed combination of a motor, a generator, a traction wheel and other devices.

U.S. Pat. No. 5,148,736 which was issued to Juang on Sep. 22, 1992, described an automatic solar-powered car ventilator.

U.S. Pat. No. 5,680,907, which was issued to Weihe on Oct. 28, 1997, described an auxiliary solar-power automobile drive system which would be an alternative source of power for the primary source of fossil fuel energy. This provided the logic but not a solution to provide enough solar power to a surveillance camera.

U.S. Pat. No. 6,380,481 which was issued to Muller on Apr. 30, 2002, involved solar panels which were used but they were retractable and the system was designed to run with the assistance of kinetic energy.

In a 1987 article, McCosh, D. "Racing with the Sun", Popular Science Magazine, November 1987, McCosh noted that solar energy was a great source of electricity. Back in 1987 McCosh was hoping for a technical breakthrough which would reduce the cost of solar panels, and now 22 years later we have the method to generate electricity for the purpose of running a surveillance camera for a fraction of the cost, as sought in 1987.

In his book, Tertzakian, P. "A Thousand Barrels a Second: The Corning Oil Break Point and the Challenges Facing an Energy Dependent World", *McGraw-Hill Professional*, 2006, 8, 23, 79, Tertzakian explained the importance of getting away from the "oil only world" we live in and start to build a portfolio of energy sources. Solar power is mentioned in his book as an important part of such an energy portfolio. This method fits Tertzakian's description perfectly as we are not replacing the power source of the vehicle, but we are providing an additional power source that will be added to the overall power use and efficiency of the device, specifically in the surveillance camera.

Finding a replacement for oil fuels is the main purpose of several books and authors in the recent years. In his book Campbell, C. J. "Oil Crisis," *multi-science publishing*, 2005, 303, also brought up the necessity of finding alternative energy sources. In light of the publicly perceived need for solar energy for transportation vehicles and/or at minimum the supplementation of the power source for the vehicle, the object of our method is to provide a solar supplemental power source to the surveillance camera. This document will describe the construction of a device capable of providing a solar energy power source to operate a surveillance camera. This method is powered by solar power and is designed using readily available products. The solar output of this device is approximately 816 Watts, 33 Volts and 24.6 Amperes. The system can be configured for different levels of desired power, current and/or voltages, but our system is optimized for usage at this configuration. The batteries used for this project are approximately 12 Volts, 290 amperes per hour, but can be configured to meet the 24 Volts at 870 amperes per hour, desired application. Power from the solar power system and battery backup is regulated by means of a "charge controller." This device provides optimal power usage from the panels while regulating the amount of charge going to the batteries and surveillance camera. The Direct Current (DC) disconnect in this system provides an extra layer of safety and facilitate efficient interconnection of the unit with wireless energy transmitter.

All of the energy generated by the solar panels is stored in batteries which have the following characteristics:

Completely sealed valve regulated;

Flame arresting pressure regulated safety sealing valves;

Operating pressure management and protection against atmospheric contamination;

Computer-aided 99.994% pure heavy-duty lead calcium grid designs;

Tank formed plates, which guarantees evenly formed and capacity matched plates;

Anchored plate groups, to guard against vibration;

Double insulating micro porous glass fiber separators;

Measured and immobilized electrolyte, for a wide range of operating temperatures, and low self discharge rates High impact reinforced strength copolymer polypropylene cases with flat top designed covers that are rugged and vibration resistant;

Thermally welded case to cover bonds that eliminate leakage;

Copper and stainless steel alloy terminals and hardware;

Multi-terminal options;

Terminal protectors;

Removable carry handles; and

Classified as "NON-SPILLABLE BATTERY" Not restricted for Air (IATA/ICAO) Provision 67, Surface (DOT-CFR-HMR49) or Water (Classified as non-hazardous per IMDG amendment 27) transportation, compatible with sensitive electronic equipment, Quality Assurance processes with ISO (4400/992579), QS and TUV Certification EMC tested, CE, ETTS Germany (G4M19906-9202-E-16), Tellcordia and Bellcore compliant, UL recognized and approved components (MH29050).

The method utilizes electrical connections with heavy duty cables with a zinc die-cast plug housing. Which is reinforced for durability, good recoil memory, chemical resistance and abrasion resistance. A temperature rating of −90° F. to 125° F.

(−68° C. to 52° C.), unbreakable PERMAPLUGS™ featuring Dupont® patented material, which meets SAE J560. Large finger grips for coupling/uncoupling, even with gloves on. Extended plug interior for easy maintenance, protected with anti-corrosive non-conductive, dielectric lithium grease. All cable assemblies are rated for 12 volt systems. All electrical wires connect with the STA-DRY® Wire Insertion Socket, 7-Way #16-720D, with split brass pins along with Anti-Corrosive Dupont Super-Tuff Nylon® housing & lid and stainless steel hinge pin & spring, with inner cavity sealed to prevent contaminants from passing to the wire harness. Extended front barrels for additional cable support, slanted 5° for moisture drain, and elongated holes for mounting adaptability.

All electricity is generated by photovoltaic laminate solar panels. Each solar panel has the following characteristics: rated power (Pmax) 144 Watts, production tolerance+/−5%; by-pass Diodes connected across every solar cell to protect the solar cell from power loss in case of partial shading or damage of individual solar cells while other cells are exposed to full sunlight.

The adhesive to secure the unit to the vehicle's roof is an ethylene propylene copolymer adhesive-sealant, with microbial inhibitor, high temperature and low light performance. The adhesive is flexible and lightweight, weighting approximately one pound per square foot, compared to five pounds per square foot for standard adhesives.

The logical center for this method is a charge controller. The charge controller we selected has the following characteristics: PWM series battery charging (not shunt); 3-position battery select (gel, sealed or flooded); very accurate control and measurement jumper to eliminate telecom noise; parallel for up to 300 Amperes temperature compensation; tropicalization: conformal coating, stainless-steel fasteners & anodized aluminum heat sink, no switching or measurement in the grounded leg, 100% solid state, very low voltage drops, current compensated low voltage disconnect, leds for battery status and faults indication, capable of 25% overloads, remote battery voltage sense terminals. The charge controller has the following electronic protections: short-circuit for solar and load, overload for solar and load, reverse polarity, reverse current at night, high voltage disconnect, high temperature disconnect, lightning and transient surge protection, loads protected from voltage spikes, automatic recovery with all protections.

Our method uses wireless electricity as a medium to deliver our solar generated and battery regulated solar energy to the surveillance camera, wireless energy example can be found in patent application US201010109445 A1 "Wireless Energy Transfer Systems" Kurs et al. Energy or power may be transferred wirelessly using a variety of known radiative, or far-field, and non-radiative, or near-field, techniques. For example, radiative wireless information transfer using low-directionality antennas, such as those used in radio and cellular communications systems and home computer networks, may be considered wireless energy transfer. However, this type of radiative transfer is very inefficient because only a tiny portion of the supplied radiated power, namely, that portion in the direction of, and overlapping with, the receiver is picked up. The vast majority of the power is radiated away in all other directions and lost in free space.

US2010/0109445 A1, continues to explain and prove how the current ways to transfer energy wireless are very inefficient. In the application, Kurs and al. describe a non-radiative or near-field wireless energy transfer scheme that is capable of transmitting useful amounts of power over mid-rage distances and alignment offsets. His inventive technique uses coupled electromagnetic resonators with long-lived oscillatory resonant modes to transfer power from a power supply, our solar method, to a power drain, a load. For the purposes of our method we will make reference to a wireless energy transmitter, and to a wireless energy receiver. As part of our method we also refer to "magnetic resonance field" where all surveillance cameras receiving the solar energy will be placed.

DRAWINGS

Figures

The method for generating electricity from solar panels to run a surveillance camera is described by the appended claims in relation to the description of a preferred embodiment with reference to the following drawings which are described briefly as follows:

DETAILED DESCRIPTION

Figure 1:
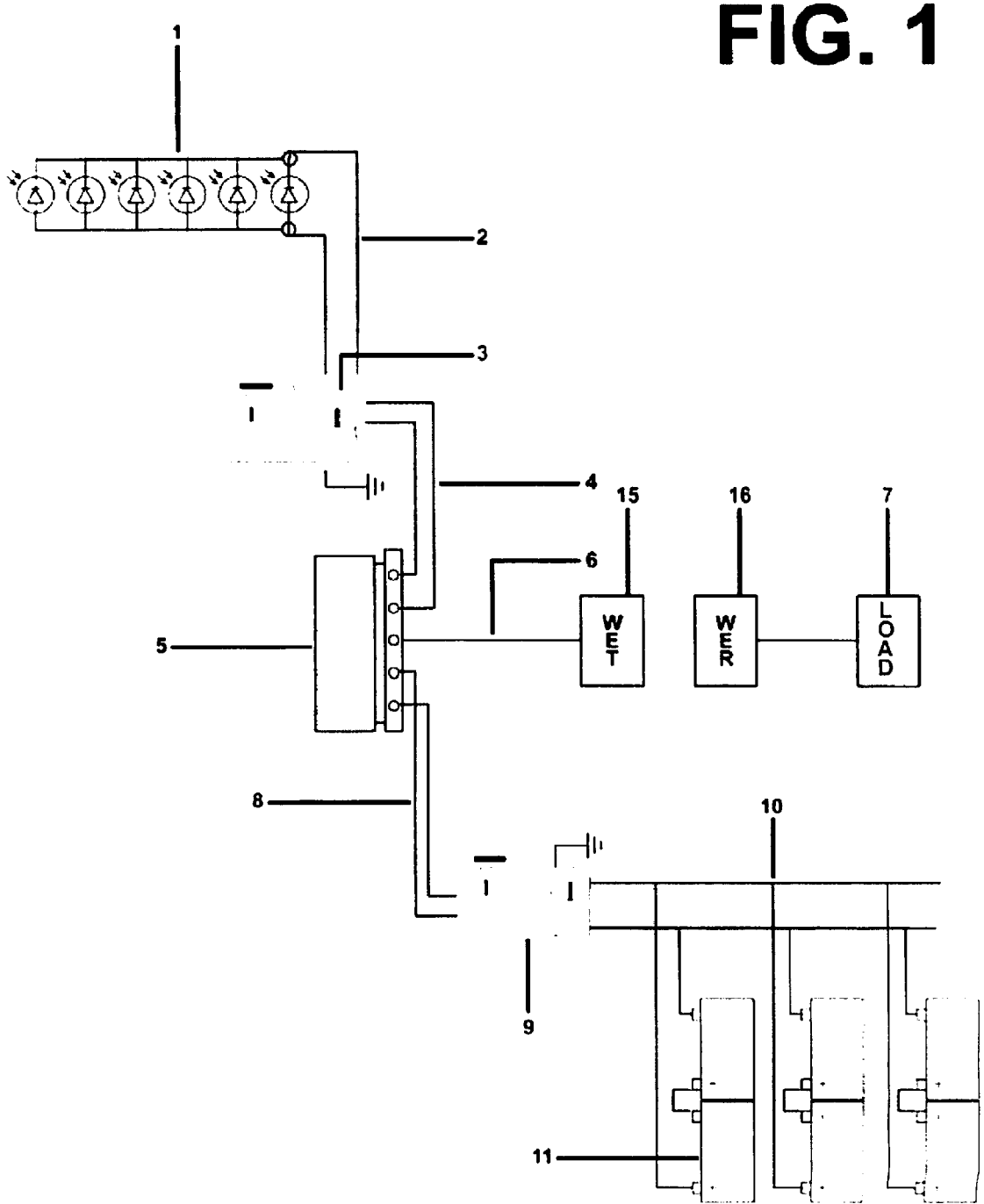
FIG. 1 is the electrical diagram of the method.
Figure 2:
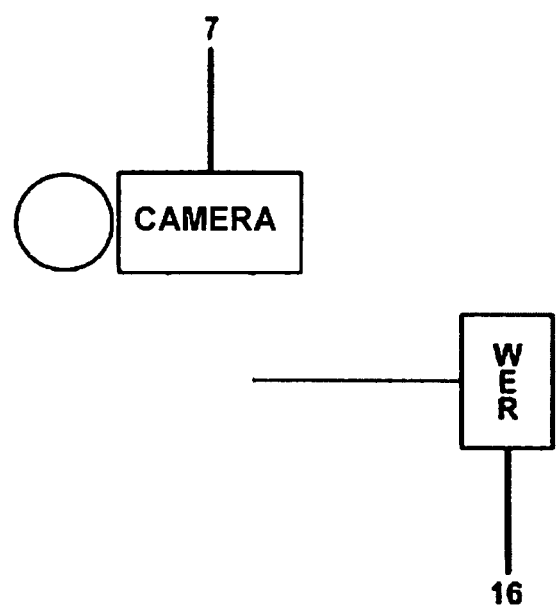
FIG. 2 is the electrical diagram detail of the surveillance camera.
Figure 3:
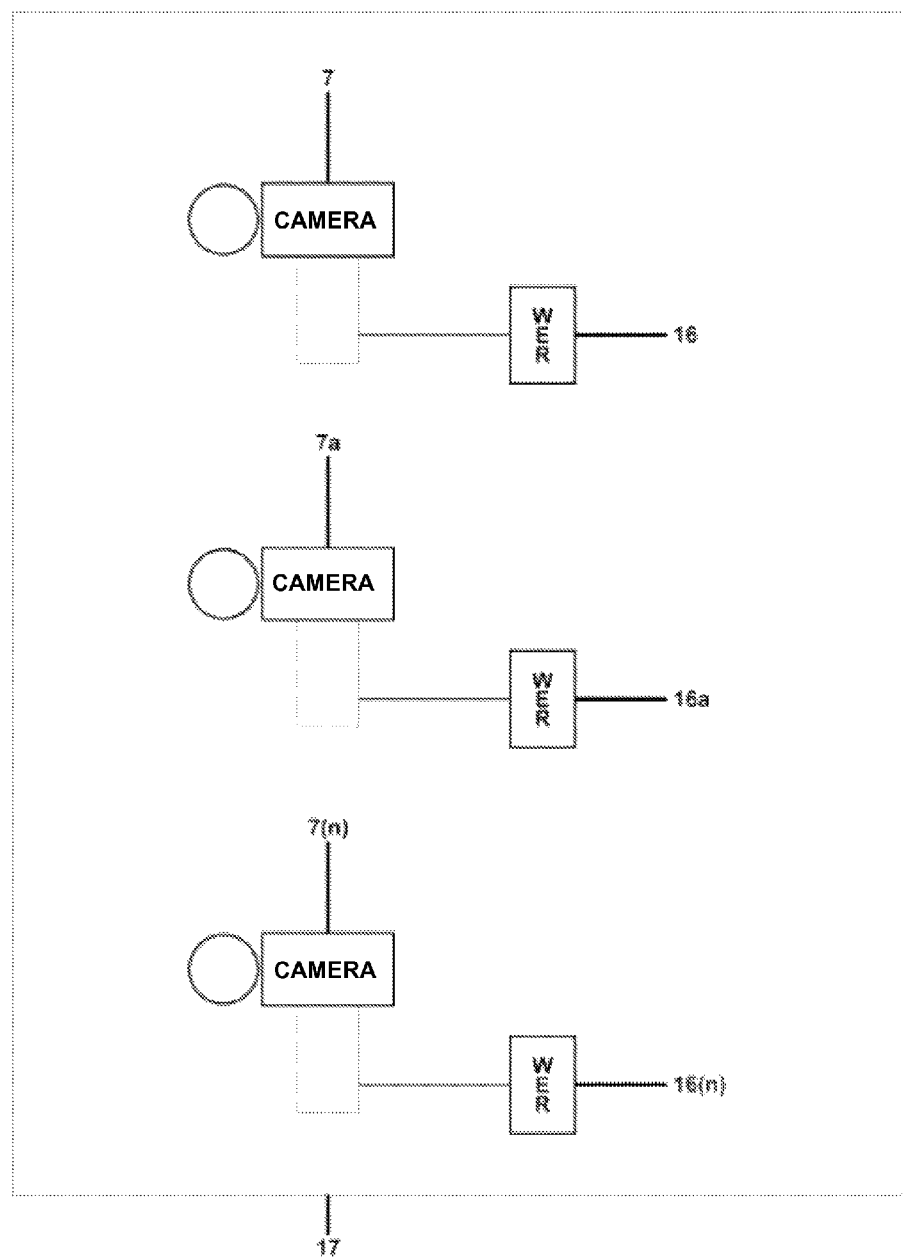
FIG. 3 is the electrical diagram of the magnetic resonance field.

FIGS. 1, 2 and 3

Preferred Embodiment

Reference is made first to FIG. 1. Photovoltaic (PV) panels 1 that receive solar energy. The electricity generated by the PV panels 1 is transmitted via a wire 2, to a Circuit Interruption Device 3 (CID). If the CID circuit 3 is closed, the electricity generated by the PV panels 1 is transmitted via a wire 4 to a charge controller 5. The charge controller 5 is designed to direct the electrical current from the PV panels 1 to a Wireless Energy Transmitter (WET) 15, the WET 15 will send the solar energy wireless to be received by Wireless Energy Receiver (WER) 16, and the WET 16 will provide power to the primary load 7 in this embodiment a surveillance camera 7 via a wire 6. If the primary load 7 is not receiving the electricity generated by the PV panels 1 the charge controller 5 sends the electricity via a wire 8 to a second Circuit Interruption Device (CID) 9. If the CID circuit 9 is closed, the electricity sent by the charge controller 5 is transmitted via a wire 10, to the batteries 11. The batteries 11 store the electricity generated by the PV panels 1. When there is no electricity generated by the PV panels 1 the charge controller 5 allows the electricity stored in the batteries 11 to be transmitted via wire 10, then via CID 9 and wire 8, to the primary load 7, via wire 6, WET 15 and WER 16. The charge controller 5 has the capability to be programmed to understand what are the circuit's the current needs. This is based on the program set in the charger controller 5 memory. The unit will be able to make logical decisions (based on the charger programmed data). If the load 7 needs power, the charge controller 5 sends electrical power to the load. If the batteries 11 are low in charge, the charge controller 5 sends power to the batteries 11.

As shown in FIG. 2, in this drawing we have WER 16, receives the electricity wirelessly and transmits to the surveillance camera 7.

As shown in FIG. 3, shows the magnetic resonance field 17, composed of several surveillance cameras 7, 7a . . . 7n, receiving wireless power from the WER units 16, 16a . . . 16n.

Other Embodiments

As described in the first embodiment the load 7 can be an electrical equipment that is not a surveillance camera. The application of the method will be the same, and the technical specifications will remain the same, but the electrical equipment or load will be of a different kind, the system can be reconfigured to generate less or more electricity if necessary, and based on today's technology. Also if future technologies arise that would require more electricity this machine's capabilities can be extended by adding more solar panels 1 and more batteries 11.

We claim:

1. A solar powered surveillance camera system comprising:
    at least one photovoltaic panel positioned on a surface exposed to sunlight;
    at least one circuit interruption device protecting against a circuit overload;
    at least one battery storing the electrical power generated by the at least one photovoltaic panel;
    a charge controller that checks a power level of the at least one battery, load consumption and amount of electrical power generated by the at least one photovoltaic panel;
    a surveillance camera;
    a wireless energy transmitter transmitting the electrical power generated by the at least one photovoltaics panel; and
    a wireless energy receiver receiving the electrical power transmitted by the wireless energy transmitter and applying the electrical power to the surveillance camera.

2. The system of claim 1, further comprising:
    an assembly receptacle that stores the at least one circuit interruption device and the charge controller; and
    an electrical connection that connects the at least one photovoltaic panel to the charge controller.

3. The system of claim 1, further comprising:
    an electrical connection between the at least one circuit interruption device and the at least one battery;
    an electrical connection between the at least one battery and the at least one photovoltaic panel.

4. The system of claim 1, further comprising:
    an additional circuit interruption device;
    wherein the charge controller is electrically connected between at least one photovoltaic panel, the at least one battery and the wireless energy transmitter, the at least one circuit interruption device being connected between the charge controller and the at least one photovoltaic panel and the additional circuit interruption device being located between the charge controller and the at least one battery.

* * * * *